United States Patent
Akaike et al.

(10) Patent No.: US 8,395,429 B2
(45) Date of Patent: Mar. 12, 2013

(54) SIGNAL GENERATING DEVICE AND FREQUENCY SYNTHESIZER

(75) Inventors: Kazuo Akaike, Sayama (JP); Tsukasa Kobata, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 13/433,554

(22) Filed: Mar. 29, 2012

(65) Prior Publication Data

US 2012/0249196 A1    Oct. 4, 2012

(30) Foreign Application Priority Data

Mar. 31, 2011    (JP) .................................. 2011-080880

(51) Int. Cl.
*H03L 7/06*    (2006.01)
(52) U.S. Cl. ........................................ 327/156; 327/299
(58) Field of Classification Search .................. None
See application file for complete search history.

(56) References Cited

U.S. PATENT DOCUMENTS 5,191,504 A * 3/1993 Narisawa et al. ............. 361/186
7,295,077 B2 * 11/2007 Thomsen et al. ................ 331/10

FOREIGN PATENT DOCUMENTS

| JP | 5-206732 | 8/1993 |
| JP | 2007-074291 | 3/2007 |

* cited by examiner

*Primary Examiner* — Cassandra Cox
(74) *Attorney, Agent, or Firm* — Jordan and Hamburg LLP (57) ABSTRACT

A frequency synthesizer using a PLL has a simple structure and excellent spurious characteristics. A reference frequency signal inputted into a phase comparison unit is generated based on a clock when a zero cross point of a sawtooth wave composed of a digital signal is detected. However, in this case, since the digital values are skipped values, the digital value does not always become zero when its positive/negative sign is inverted. Hence, where the clock signals reading the digital value immediately before and the digital value immediately after the zero cross time when the positive/negative sign is inverted in a region where the digital value gradually changes are P1 and P2 respectively and the clock signal at a timing next to the clock signal P2 is P3, P1 and P3 are used at a ratio corresponding to the ratio between the digital values read by P1 and P2.

5 Claims, 12 Drawing Sheets

| CLOCK NUMBER | INPUT VALUE | OUTPUT VALUE | DECIMAL VALUE |
|---|---|---|---|
| 0 | 1 | 0000 | 0 |
| 1 | 1 | 0001 | 1 |
| 2 | 1 | 0010 | 2 |
| 3 | 1 | 0011 | 3 |
| 4 | 1 | 0100 | 4 |
| 5 | 1 | 0101 | 5 |
| 6 | 1 | 0110 | 6 |
| 7 | 1 | 0111 | 7 |
| 8 | 1 | 1000 | -8 |
| 9 | 1 | 1001 | -7 |
| 10 | 1 | 1010 | -6 |
| 11 | 1 | 1011 | -5 |
| 12 | 1 | 1100 | -4 |
| 13 | 1 | 1101 | -3 |
| 14 | 1 | 1110 | -2 |
| 15 | 1 | 1111 | -1 |
| 16 | 1 | 0000 | 0 |
| 17 | 1 | 0001 | 1 |
| 18 | 1 | 0010 | 2 |

SIGNAL GENERATING DEVICE AND FREQUENCY SYNTHESIZER

BACKGROUND OF THE INVENTION

1. Field of the Invention

The present invention relates to a signal generating device and a frequency synthesizer.

2. Description of the Related Art

As one of standard signal generators, there is a known frequency synthesizer using a PLL (Phase Locked Loop) which is applied to, for example, a local oscillating part in a mobile station, a test signal source of a radio communication device, a broadcasting device, and the like. When the frequency synthesizer is applied in, for example, a communication field, its noise has to be small in order to avoid interference with other channels, and it is desirably capable of setting the frequency as finely as possible in the state that radio waves are congested.

Hence this applicant has developed a frequency synthesizer with a simple circuit configuration satisfying the above needs, and its technique has already been disclosed in Patent Document 1 and the like. For example, in the method in Patent Document 1, the output signal of a voltage controlled oscillator is A/D (analog/digital) converted, the digital signal is processed and D/A converted, and the obtained analog signal is inputted into the voltage controlled oscillator as a control voltage.

However, such a device performs A/D (analog/digital) conversion and then processes and D/A converts the digital signal, and thus has a limit in improving the spurious characteristics. In addition, there is a problem that its circuit is not sufficiently simplified because of both A/D conversion and D/A conversion.

Patent Document 2 discloses a method of generating a triangular wave of a frequency according to digital data and obtaining a zero cross timing of an analog triangular wave using a comparator to obtain a pulse signal of the frequency corresponding to the frequency of the triangular wave. In this technique, after D/A conversion of the digital data, the analog triangular wave is linearly interpolated. The purpose of linear interpolation is to fix the zero cross timing to a timing according to the frequency because the timing of the analog triangular wave crossing a zero point cannot be made more accurate than a sample timing of the digital signal (paragraphs 0019 to 0023). However, when a reference signal is generated using the signal generator to form a PLL, the zero cross of the triangular wave cannot be accurately detected, and therefore the technique is not enough to decrease the phase noise.

To wrap up the above, it is requested to produce a frequency synthesizer with a simple circuit configuration, and when constituting a frequency synthesizer responding to the request, it is also requested to generate an excellent signal with low noise for a standard signal used for a reference signal, for example, a clock signal with a simple circuit configuration.

Patent Document 1: Japanese Patent Application Laid-open No. 2007-74291

Patent Document 2: Japanese Patent Application Laid-open No. Hei 5-206732

SUMMARY OF THE INVENTION

The present invention has been made under such circumstances, and an object of the present invention is to provide a technique capable of generating a frequency signal with low noise which can be used, for example, for a reference signal of a frequency synthesizer. Another object of the present invention is to provide a frequency synthesizer using a PLL which has a simple configuration and excellent spurious characteristics.

A signal generating device of the present invention is a signal generating device outputting a pulse signal based on a timing when an integrated waveform in a sawtooth shape crosses over a previously set threshold value, the device including:

a clock source outputting a clock signal;

an integrated waveform generation unit receiving an inputted digital signal having a digital value according to a set frequency and integrating the digital value based on the clock signal to generate the integrated waveform in a sawtooth shape;

a clock information output unit outputting a head clock signal and a rear clock signal reading a head digital value and a last digital value in a string of odd digital values at regular intervals including digital values before and after the previously set threshold value in a region where the digital value outputted from the integrated waveform generation unit changes in one direction;

a circuit unit outputting a coefficient value corresponding to a ratio between a difference value among the head digital value and the threshold value, and a difference value among the last digital value and the threshold value;

a use ratio determination unit outputting a signal corresponding to a use ratio between the head clock signal and the rear clock signal regarded as a time point when the digital value of the integrated waveform is the threshold value for only a predetermined time, based on the coefficient value;

a clock selection unit selecting and outputting one side of the head clock signal and the rear clock signal outputted from the clock information output unit, for only a predetermined time, by the signal corresponding to the use ratio outputted from the use ratio determination unit; and a signal output unit outputting a pulse signal obtained by being toggled by each clock signal outputted from the clock selection unit.

The previously set threshold value is, for example, zero.

In a concrete example, assuming that the clock signals reading the head digital value and the last digital value are P1 and P3 respectively, and the clock signal reading a digital value at a middle in the string of the odd digital values is P2, the clock information output unit is configured to output the clock signals P1 and P3, and the head clock signal and the rear clock signal regarded as a time point when the digital value of the integrated waveform is the threshold value for only a predetermined time in the use ratio determination unit are the clock signals P1 and P3 respectively.

Further, the clock selection unit is configured to select the head clock signal by one of "H" and "L" that are signal levels of the pulse signal being a selection signal, and select the rear clock signal by the other, and the use ratio determination unit being a $\Delta\Sigma$ circuit outputting a PWM pulse string forming the selection signal having an average of a duty ratio being a value corresponding to the ratio between the digital value immediately before and the digital value immediately after the threshold value.

A frequency synthesizer of the present invention feeds back a frequency signal outputted from a voltage controlled oscillator to a phase comparison unit via a frequency divider, compares the fed back frequency signal to a reference frequency signal corresponding to a set frequency in the phase comparison unit, and inputs a comparison result into the voltage controlled oscillator, wherein a signal outputted from the signal generating device of the present invention is used as the reference frequency signal.

EFFECT OF THE INVENTION

The present invention focuses attention on the point that for generating the reference frequency signal used, for example, in the frequency synthesizer using a PLL based on the clock when detecting a previously set threshold value, for example, the zero cross point of the sawtooth wave composed of the digital signal, the digital value does not always become the threshold value since the digital values are skipped values. Therefore, two clock signals before and after the threshold value are used at a ratio corresponding to the ratio between the digital value immediately before and the digital value immediately after the digital value crosses over the threshold value in a region where the digital value gradually changes. Therefore, it is possible to obtain a frequency signal with lower noise than that in a method of using the clock signal immediately before or immediately after the threshold value in a single uniform manner. By configuring the frequency synthesizer using the frequency signal, an effect of improving spurious characteristics is achieved.

DETAILED DESCRIPTION OF THE PREFERRED EMBODIMENTS

Figure 1:
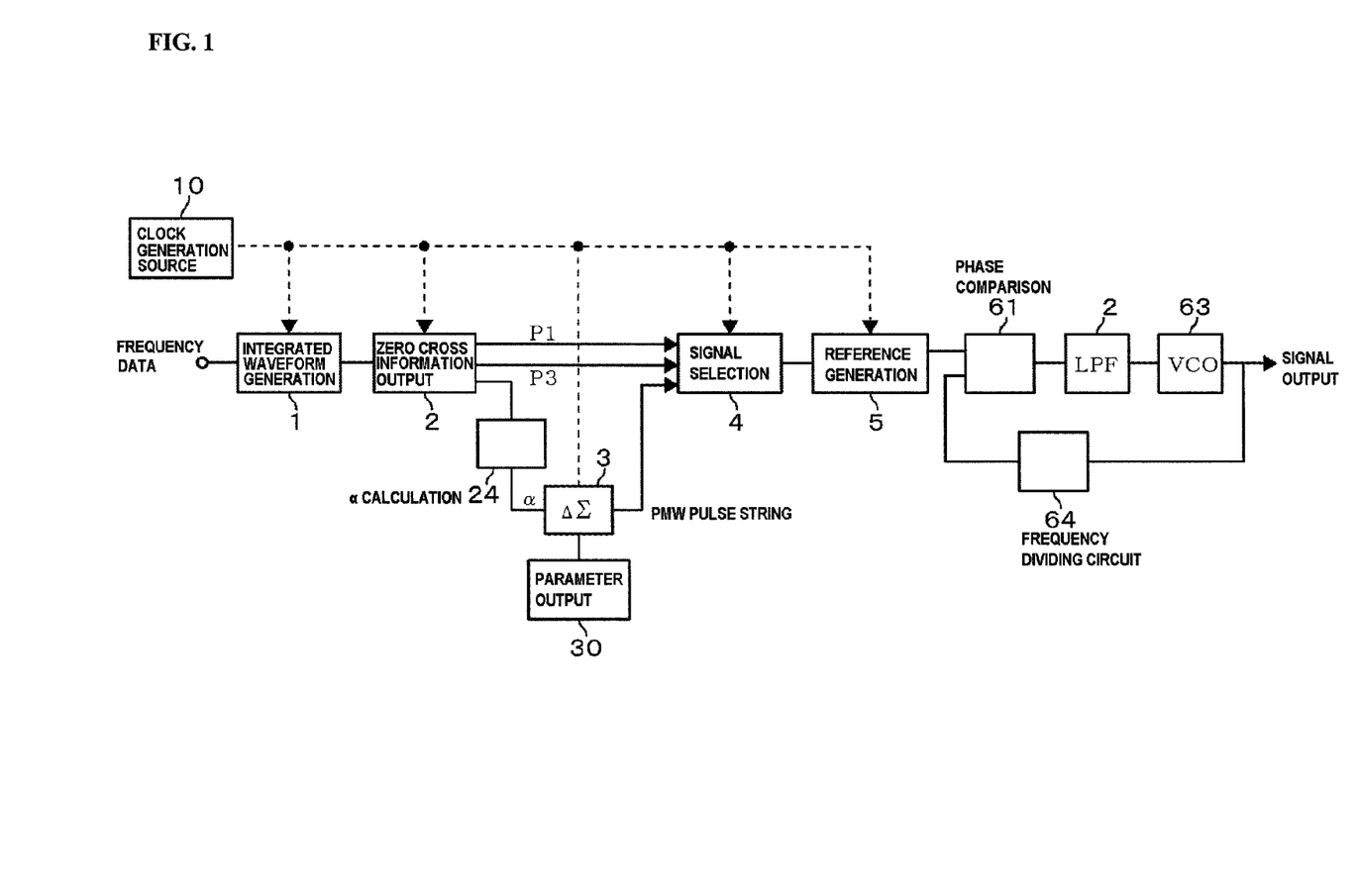
FIG. 1 is a block diagram illustrating the whole configuration of an embodiment of a frequency synthesizer according to the present invention.
Figure 2:
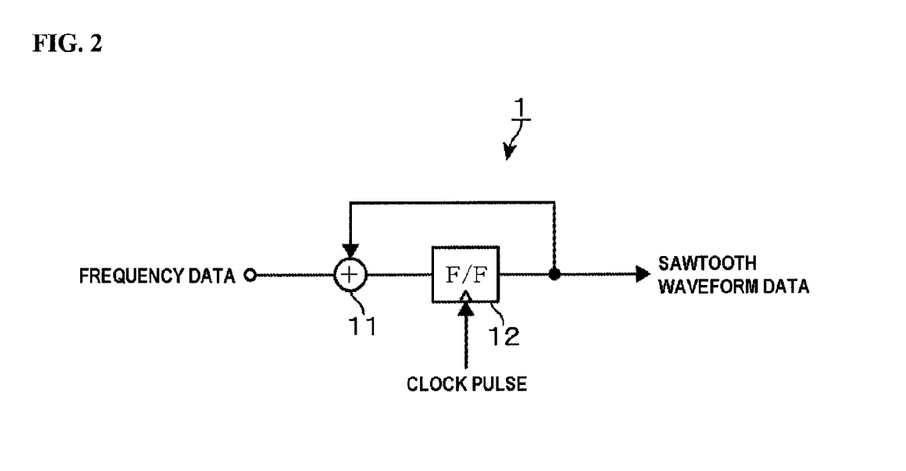
FIG. 2 is a block diagram illustrating circuits of an integrated waveform generation unit.

Describing an embodiment in which a signal generating device according to the present invention is applied to a frequency synthesizer, FIG. 1 is a block diagram illustrating the whole configuration of this embodiment in which a numeral 1 denotes an integrated waveform generation circuit unit. The integrated waveform generation circuit unit 1 has a function to output, as digital data, a sawtooth wave of a frequency according to the inputted digital value (frequency data), and is provided with a flip-flop circuit 12 at a stage subsequent to an addition unit 11 and configured to add, in the addition unit 11, the output from the flip-flop circuit 12 and the input value as illustrated in FIG. 2. A clock signal is inputted from a clock generation source 10 to the flip-flop circuit 12, and the input data from the addition unit 11 is outputted at a timing of input of the clock signal. The frequency of the clock signal is set, for example, to about 20 MHz when, for example, 5 MHz is desired as the frequency of the sawtooth wave specified by an outputted digital value group.

The operation of the integrated waveform generation circuit unit 1 will be described with reference to FIG. 3 exemplifying the case that it to operates with a 4-bit digital value for convenience of description. The digital value is handled as a complement of "2." Assuming that the input value being the frequency data inputted into the circuit unit 1 is, for example, "0001," the input value is added to increase the sum, and when the sum reaches "0111" and then "0001" is inputted, the sum becomes "1000" and the decimal value changes into a negative value. Accordingly, the relation among the pulse number (number of convenience) of the clock signal inputted into the flip-flop circuit 12 and the frequency data (input value) and the output value is as presented in FIG. 3, and the output waveform becomes a sawtooth wave being an integrated waveform of the input value as illustrated in FIG. 4. Since the frequency of the sawtooth wave is determined according to the input value being the set frequency data, the frequency data is data determining the set frequency of a signal generator as will be described later. Note that the digital signal of the integrated waveform generation circuit unit 1 is explained as being four bits, but a signal of, for example, 32 bits is actually used.

Figure 6:
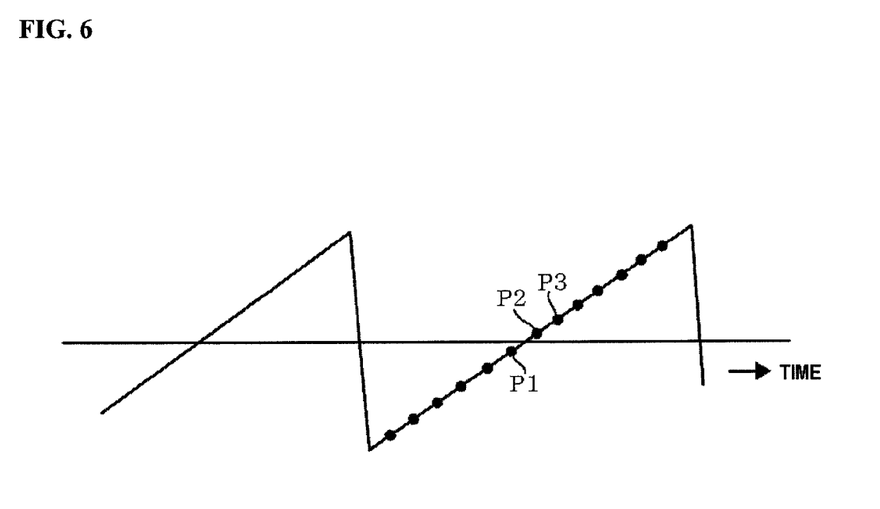
FIG. 6 is an explanatory chart illustrating the appearance of a sawtooth wave being an integrated waveform crossing a zero point.

A zero cross information output unit 2 is provided at a stage subsequent to the integrated waveform generation circuit unit 1, and a ΔΣ circuit 3 being a use ratio determination unit and a signal selection unit 4 are provided at stages subsequent to the zero cross information output unit 2. To give priority to easy understanding, the purposes and roles of these circuits will be described prior to description of the configurations of the zero cross information output unit 2, the ΔΣ circuit 3, and the signal selection unit 4.

Where the clock signal reading the digital value immediately before the zero cross time when the sign of the digital value is inverted from negative to positive in a region where the digital value constituting the sawtooth wave outputted from the integrated waveform generation circuit unit 1 gradually changes is P1, the clock signal reading the digital value immediately after the zero cross time is P2, and the clock signal delayed by two clocks from the clock signal P1 is P3, the relation between the clock signals P1 to P3 and the digital values of the sawtooth wave is expressed as illustrated in FIG. 6. Note that the actual waveform chart of the sawtooth wave is stepwise for each digital value.

Figure 3:
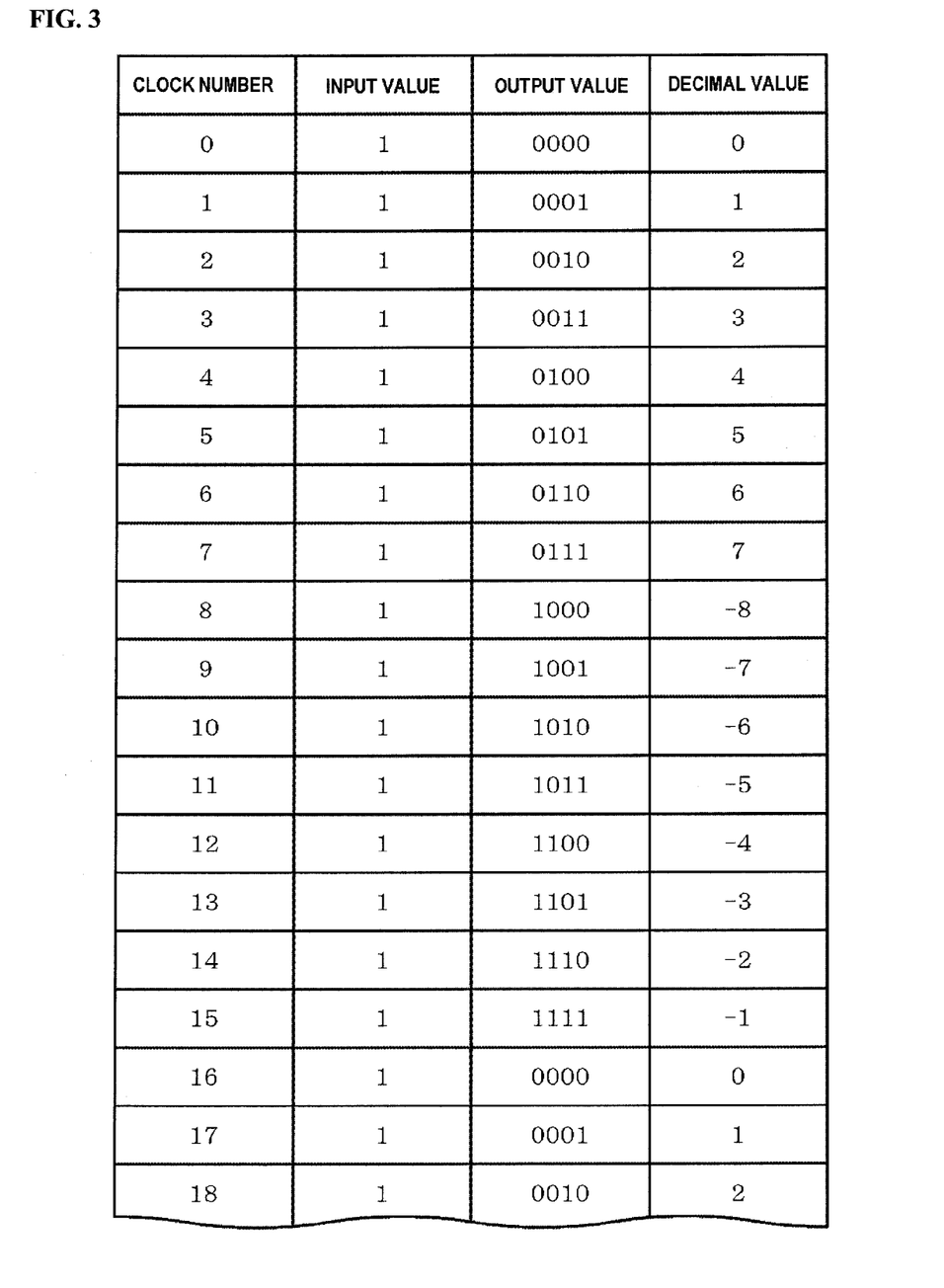
FIG. 3 is an explanatory chart illustrating the operation of the integrated waveform generation unit.
Figure 4:
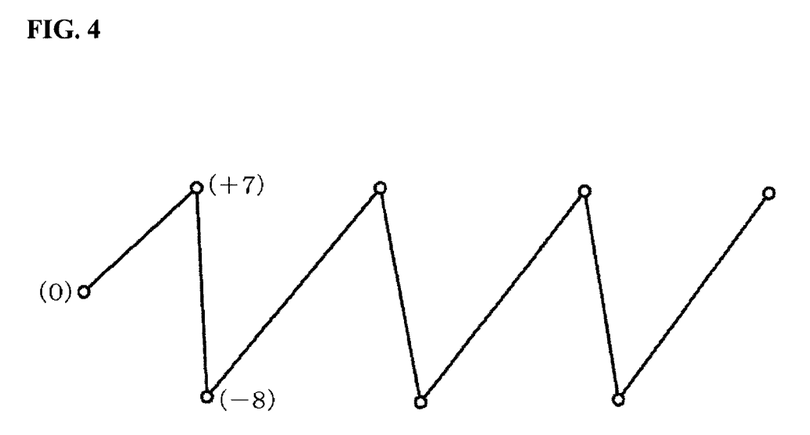
FIG. 4 is a waveform chart illustrating an output waveform of the integrated waveform generation unit.

The sawtooth wave in the example illustrated in FIG. 3 is incremented by "1" in the decimal value since the input value (digital value) being the frequency setting data inputted into the integrated waveform generation circuit unit 1 is "1" (0001), and therefore there is a timing when the digital value is "0", same as the first threshold value every time the sawtooth wave is repeated. However, if the input value is "3"

(0011), there is no clock signal detecting the accurate zero cross point, namely, "0" since the digital value increases, for example, to be "−7," "−4," "−1," "2."

On the other hand, the frequency setting data inputted into the integrated waveform generation circuit unit 1 is a setting signal for setting the frequency finally outputted from a later-described voltage controlled oscillator. Assuming that the frequency of the clock signal outputted from the clock generation source 10 is, for example, 16 MHz, the frequency of the sawtooth wave is 1 MHz (see FIG. 3) when the frequency setting data is "1," and the frequency of the sawtooth wave is 2 MHz when the frequency setting data is "2." The example in FIG. 3 is a schematic example for explanation, and the digital signal is actually composed of, for example, 32 bits, and the digital value rarely takes "0."

Therefore, the digital value crosses over "0" when shifting from negative to positive in most cases, and thus the accurate zero point cannot be detected. In this case, it is conceivable that P1 being the clock signal reading the digital value immediately before zero cross is regarded as the zero cross point in which case, however, it is difficult to obtain excellent spurious characteristics of the frequency synthesizer. Hence, in this embodiment, one of the clock signals P1 and P3 is regarded as the zero cross point, and the use ratio between the clock signals P1 and P3 handled as the zero cross point, namely, the selection ratio between the aspect of using the clock signal P1 as the zero cross point and the aspect of using the clock signal P2 as the zero cross point is determined based on the digital value at P1 (the digital value read by P1) and the digital value at P2. Note that the expression that the digital value corresponding to the clock signal P1 (P2, P3) is abbreviated to "the value of P1 (P2, P3)" in the following description.

Figure 7:
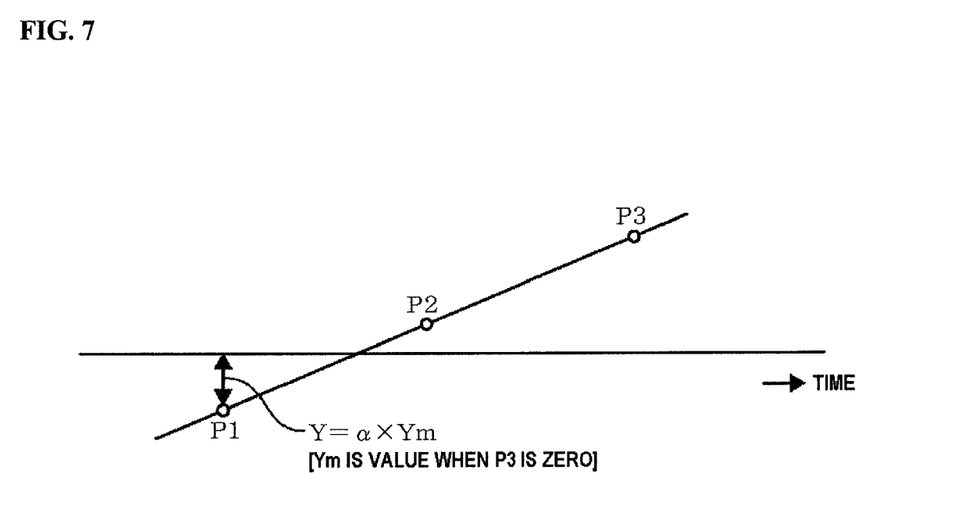
FIG. 7 is an explanatory chart illustrating the appearance of the sawtooth wave being the integrated waveform crossing the zero point.

More specifically, since the frequency setting data has been determined, the value of P1 when P2 is "0", same as the first threshold value in FIG. 7 is previously known. Assuming that this value is "−50", same as the second threshold value, for convenience of explanation, when the value of P1 is "−50" the accurate zero cross point will be located at a middle position between the clock signals P1 and P3. The use ratio between the clock signals P1 and P3 in this case is 50%, and the numbers of the clock signals P1 and the number of clock signals P3 used as the zero cross pulses in a predetermined time are 1:1. In more general, assuming that the use ratio is a as illustrated in FIG. 7, when the value of P1 is Y, α can be expressed by α=1−(Y/Ym). Ym is the value of P1 when P3 is the zero cross point, and α is 0.5 (50%) when Y is 0.5 Ym. When Y is 0, α is 1 (100%) in which case the clock signal used as the zero cross pulse in the predetermined time is only P1. When Y is Ym/3, α is ⅔ (66.7%) in which case the number of the clock signals P1 and the number of clock signals P3 used as the zero cross pulses in the predetermined time are 2:1.

Figure 8:
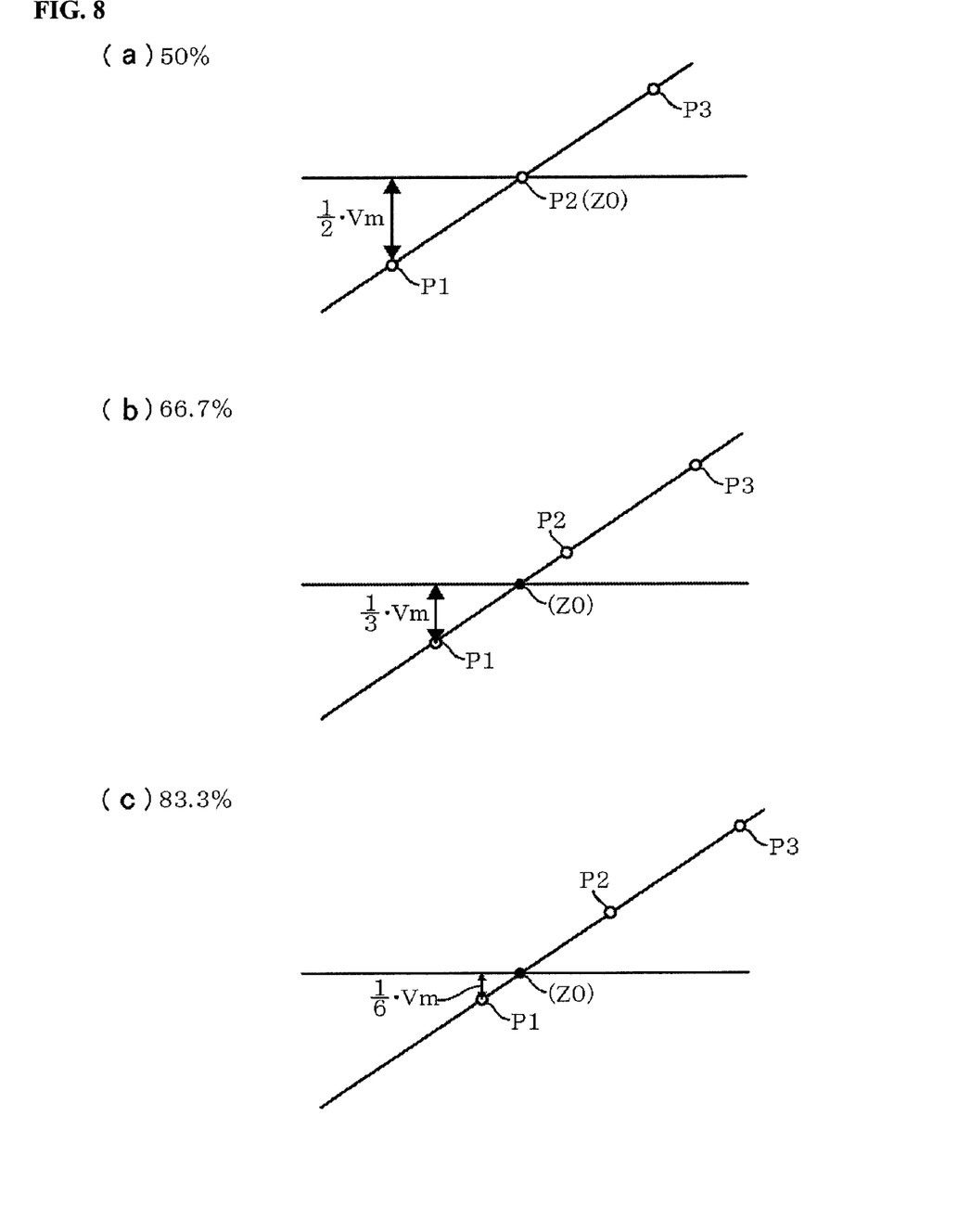
FIG. 8 is an explanatory chart for explaining a coefficient value corresponding to a ratio between a digital value immediately before and a digital value immediately after a zero cross time of the sawtooth wave being the integrated wave.

FIG. 8 is a chart depicting the values and temporal positions of P1 to P3 and examples of the use ratio (%) between the clock signals P1, P3 in association. When the clock signal P2 is at the zero cross point (when the value of P2 is 0), the clock signals P1, P3 are used in halves in a predetermined time, and the number of use times of the clock signal P1 is increased as the value of P1 gets closer to 0 from that state. In other words, even though the accurate zero cross point is not obtained, the ratio between the value of P1 and the value of P2 does not vary so much in the predetermined time, and the average value of digital values regarded as the zero cross point in the predetermined time is supposed to be a value close to 0. This supposition is proved to be appropriate from a later-described experiment.

Figure 5:
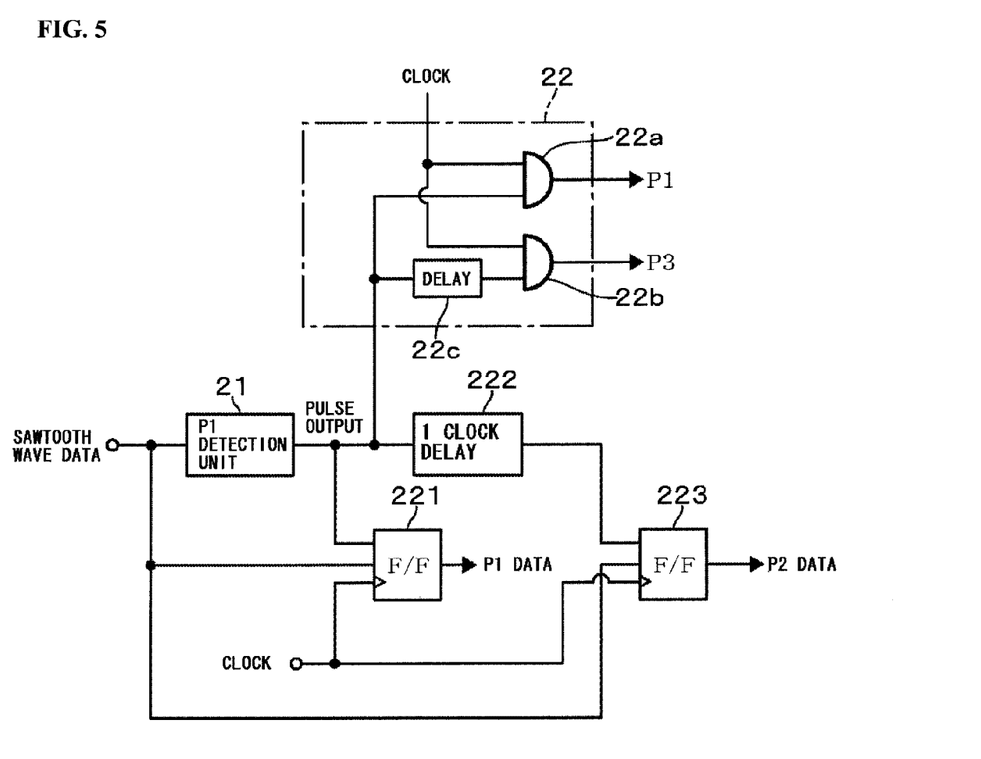
FIG. 5 is a block diagram illustrating a zero cross information output unit.

Explaining a circuit part performing such so-called pseudo processing of the zero cross point, the zero cross information output unit 2 includes a P1 detection unit 21 as illustrated in FIG. 5. The P1 detection unit 21 is for detecting the timing that the digital value constituting the sawtooth wave excesses the second threshold value, and is configured to compare the digital value and the second threshold value and to output a P1 detection pulse when the digital value become the value more than the second threshold value from the value that is smaller than the second threshold value.

As mentioned above, the second threshold value is the same as the P1 value when P2 indicates "0", which is same as the first threshold value. In FIG. 7 (shown later), the second threshold value is corresponded to Ym/2. The reason why the second threshold value is set as described above, is because P1 exists between the first threshold value and the second threshold value. A numeral 22 in FIG. 5 denotes a circuit unit for outputting the two clock signals P1, P3 which are candidates of the zero cross point, and includes two AND circuits 22a, 22b each taking AND of the zero cross detection pulse and the clock signal and a delay circuit 22c delaying the zero cross detection pulse inputted into one AND circuit 22b by two clocks.

A numeral 221 denotes a flip-flop circuit outputting the sawtooth wave data (digital value) as the value of P1 using the zero cross detection pulse as a latch enable signal, and a numeral 223 denotes a flip-flop circuit outputting the sawtooth wave data as the value of P2 using the pulse made by delaying the zero cross detection pulse by one clock in a delay circuit 222 as a latch enable signal. The ratio α is obtained using only the value of P1 in this embodiment but, for example, if the cycle of the sawtooth wave is unknown, namely, if the interval value between mutually successive digital to values is unknown, the value of P2 is also required because the value of P2 subsequent to the value of P1 is unknown.

Returning to FIG. 1, the value of P1 obtained in the zero cross information output unit 2 is captured into a circuit unit 24 calculating a that is the use ratio between the clock signals P1, P3, and the already-described calculation (α=1−(Y/Ym)) is performed in the circuit unit 24. The ΔΣ circuit 3 is a circuit part capturing a being the use ratio and outputting a PWM (pulse with modulation) pulse string having an average value of a duty ratio of α only for a predetermined time. The ΔΣ circuit 3 further captures the use ratio α and generates the ratio between P1 and P3 by ΔΣ modulation to reduce near quantization noise. A numeral 30 denotes a parameter output unit and a part outputting parameters necessary for the circuit unit 24 and the ΔΣ circuit 3 and a feedback gain (variable depending on the frequency) for the ΔΣ circuit 3. Note that the circuit unit 24 can be handled as a part of the zero cross information output unit 2.

Figure 9:
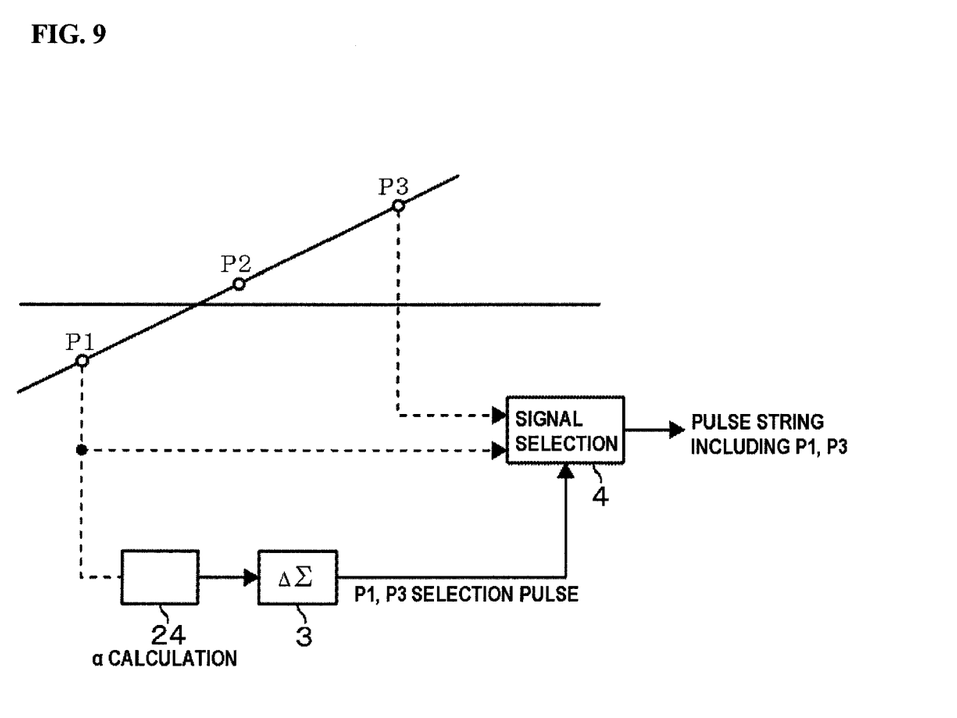
FIG. 9 is an explanatory view illustrating part of circuit elements illustrated in FIG. 1 and digital data constituting the sawtooth wave in association.

The signal selection unit 4 has a function to output the string of the clock signals (the string of the pseudo zero cross points) each of which is one of the clock signals P1, P3 outputted from the zero cross information detection unit 2 and selected by the P1, P3 selection signal outputted from the ΔΣ circuit 3 and regarded as the zero cross point. FIG. 9 is an explanatory view illustrating the digital data constituting the sawtooth wave and the ΔΣ circuit 3 and the signal selection unit 4 in association. The signal selection unit 4 includes an AND circuit 41 taking an AND condition of the pulse signal P1 and the signal from the ΔΣ circuit 3, an AND circuit 42 taking an AND condition of the pulse signal P3 and a signal made by inverting the signal from the ΔΣ circuit 3 in an inverter circuit 43, and an OR circuit 44 taking an OR condition of the AND circuits 41, 42.

At a stage subsequent to the signal selection unit 4, a reference signal generation unit 5 is provided which generates a reference signal that is a reference frequency signal used in a later-described PLL. The reference signal generation unit 5 has a function to output a pulse toggled by the pulse signal regarded as the zero cross point outputted from the signal selection unit 4, as the reference signal.

At stages subsequent to the reference signal generation unit 5, a phase comparison unit 61, a low-pass filter (LPF) 62, a voltage controlled oscillator (VCO) 63, and a frequency dividing circuit 64 are provided which constitute the PLL.

Though the operations of part of the circuits in FIG. 1 have been already described in detail, the whole operation of the above-described embodiment will be described briefly and collectively here. The setting of the frequency to be obtained from the frequency synthesizer is performed by a not-illustrated setting part, the frequency data according to the set frequency is inputted from the setting part to the integrated waveform generation circuit unit 1, and the sawtooth wave composed of the digital signal is generated as illustrated as a schematic example in FIG. 4 and FIG. 6. The sawtooth wave is for determining the phase in the later-described PLL. The zero cross information output unit 2 reads the digital values forming the sawtooth wave by the clock signals from the clock generation source 10, and outputs the clock signal P1 reading the digital value immediately before the zero cross time when the positive/negative sign is inverted in a region where the digital value gradually changes, namely, the zero cross time when the sign is inverted from negative to positive in this example, and the clock signal P3 delayed by two clocks from the clock signal P1. Further, the digital value (the value of P1) read by the clock signal P1 is outputted from the zero cross information output unit 2.

Further, the ratio at which the clock signals P1 and P3 regarded as the zero cross point are used is determined based on the value of P1 as has been described in detail using FIG. 7 and FIG. 8, and the P1, P3 selection signal corresponding to the ratio (use ratio) is outputted. The series of determination is performed by the circuit unit 24 and the ΔΣ circuit 3.

Figure 10:
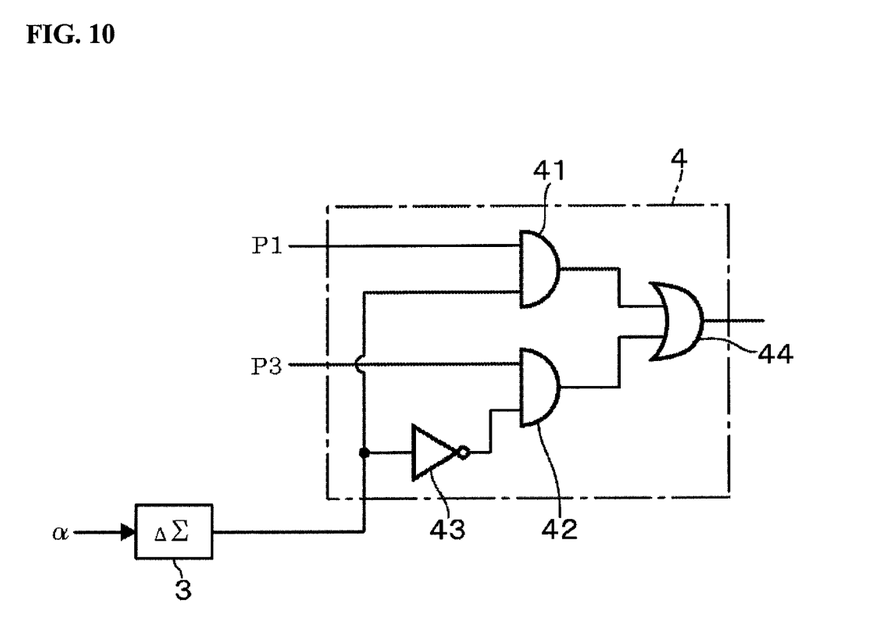
FIG. 10 is a circuit diagram illustrating a clock selection unit.
Figure 11:
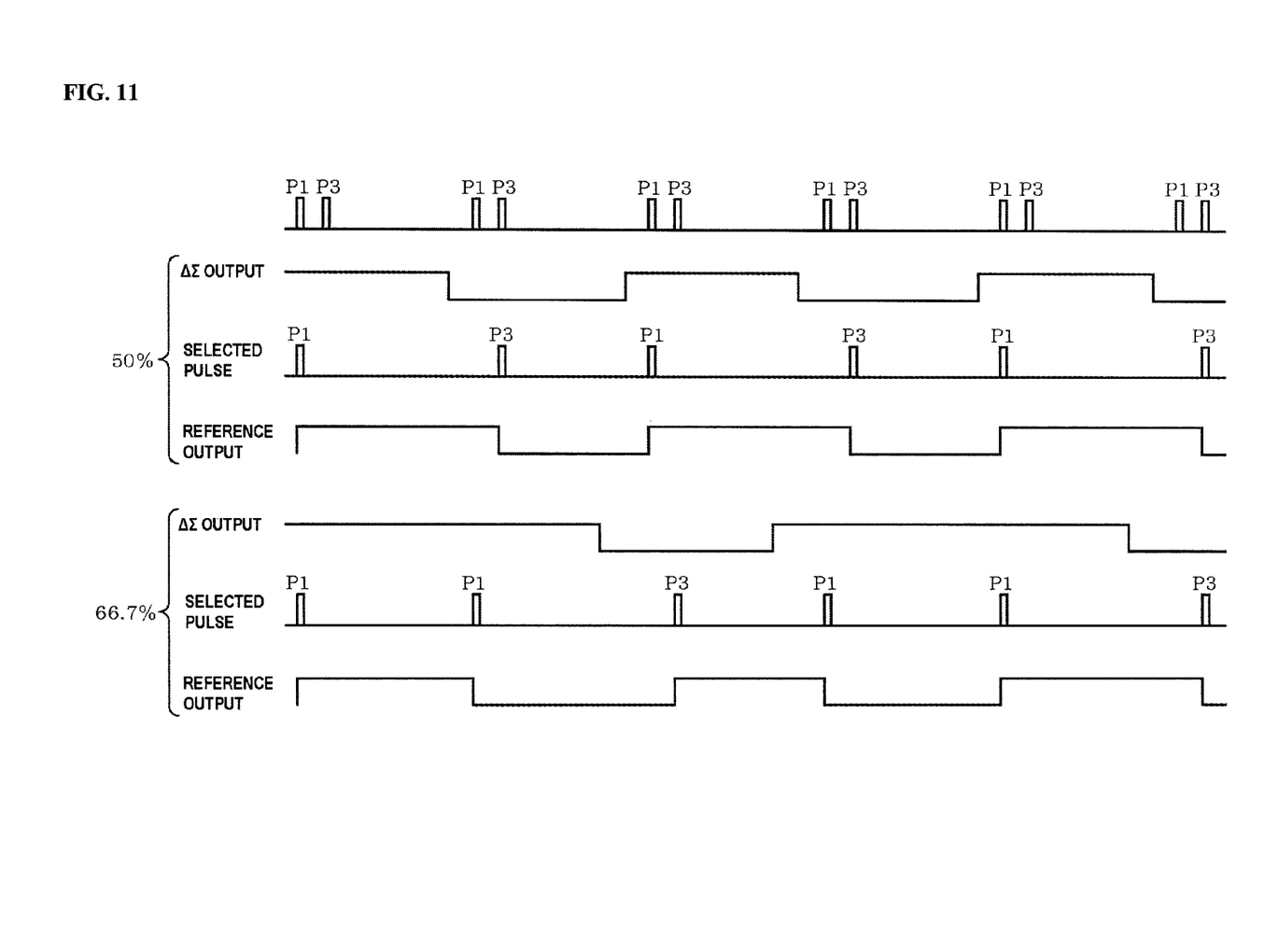
FIG. 11 is a time chart illustrating the appearance that clock signals P1, P3 are selected according to a coefficient value corresponding to the ratio between the digital value immediately before and the digital value immediately after the zero cross time of the sawtooth wave being the integrated wave.

FIG. 11 is a time chart illustrating the clock signals P1 and P3 outputted from the zero cross information detection unit 2, the PWM pulse string outputted from the ΔΣ circuit 3, and the reference signal generated in the reference signal generation unit 5 in association. Note that the length on the time axis is illustrated in a schematic size due to space limitation. As illustrating the signal selection unit 4 in FIG. 10, the clock signal P1 is selected by "H" of the output of the ΔΣ circuit 3, and the clock signal P3 is selected by "L" of the output of the ΔΣ circuit 3. Accordingly, when the use ratio is 50% (α is 0.5), the pulse string with a duty ratio of 50% is outputted from the output of the ΔΣ circuit 3 so that the clock signals P1, P2 are alternately selected.

Since it is difficult to illustrate the practical appearance of selection of the clock signal when the use ratio is 66.7%, the selection is illustrated supposing that a pulse with a duty ratio of ⅔ is outputted from the output of the ΔΣ circuit 3. In this case, the clock signal P1 is selected twice and the clock signal P2 is selected once. Actually, the number of selection times of the clock signals P1 and P2 in a set time is 2:1 as a result of selection by the PWM pulse string. As has been described, such processing is performed on the assumption that the correct zero cross point rarely changes in a short set time.

Then, the reference signal is obtained by toggle by the pulse string of the selected clock signal P1 or P2, and the frequency signal transmitted from the voltage controlled oscillator 63 via the frequency dividing circuit 64 and the reference signal are compared in phase in the phase comparison unit 61, and the result becomes a control voltage for the voltage controlled oscillator 63 to constitute a PLL loop, so that when the PLL is locked, the frequency signal being the set frequency is obtained from the voltage controlled oscillator 63.

According to the above embodiment, the sawtooth wave is generated based on the frequency setting data being the digital signal in the frequency synthesizer using a PLL, and the reference signal is generated generally by detecting the zero cross point of the sawtooth wave. Accordingly, it is unnecessary to perform A/D conversion and D/A conversion as in the method in the above Patent Document 1, leading to a simplified circuit configuration. In addition, for generating the reference frequency signal used in the frequency synthesizer using a PLL based on the clock when detecting the zero cross point of the sawtooth wave composed of the digital signal, attention is focused on the point that the digital value does not always become zero when its positive/negative sign is inverted since the digital values are skipped values.

Therefore, the clock signals P1, P3 reading the digital values before and after the zero cross time when the positive/negative sign is inverted in a region where the digital value gradually changes are regarded as candidates of the pseudo zero cross point, and the use ratio between the clock signals P1, P3 is determined based on the digital values immediately before and immediately after the zero cross time (incidentally, if the value of one is known, the value of the other is also is known). Further, supposing that a clock close to the accurate zero cross point can be taken out by averaging the timings of the clock signals P1, P3 in terms of time, the reference signal is obtained by being toggled by the selected clock signal P1, P3. Therefore, the spurious characteristics of the output of the frequency synthesizer are excellent.

The digital value of the sawtooth wave may be gradually decreased from positive to negative in the present invention, in which case the point in time when the digital value is inverted from positive to negative is the zero cross time. Though the value of P1 is used to determine the use ratio between the clock signals P1, P3 in the above example, the value of P2 may be used or a method of using the values of both P1, P2 to obtain the ratio between them may be used.

Further, the clock signal regarded as the zero cross point is not limited to P1, P3, but any point (except for the point where the sign is inverted), for example, constituting the sawtooth wave and satisfying the condition of P1, P3 may be used. More specifically, even if data after a certain number of pieces of data, for example, after five pieces of data, after the data of the sawtooth wave is changed from negative to positive is handled as P1, the situation is substantially the same as in the above embodiment. In this case, for example, when the digital value constituting the data is zero, the pulses of P1, P3 are used 50% each. In the case of a pulse after odd pulses after P1, data is located between both pulses, and therefore a group of P1, P5 may be used.

In other words, since the present invention is a method of outputting a pulse signal from a signal output unit every time the sawtooth wave takes a certain value (the first threshold value), the first threshold value is not limited to zero. For example, as illustrated in FIG. 5, P1 detection unit 21 can be configured as zero cross detection unit 21 (which detects the change of the digital value from negative to positive, for example, the moment that MSB changes from 1 to 0.) As a example in this case, if we call the clock signal next to P3 as "P4", the three clock signals, P2, P3, and P4 are used, and P2 is used as the head clock signal and P4 is used as the last clock signal. And if the difference value between the values before and after configuring the sawtooth wave is "50", the first threshold value is "50" and the second threshold value is "0". And if the value of the P2 is obvious, the difference between P2 and the second threshold value, and the difference between P4 and the second threshold value become also obvious, so the ratio α can be determined. As the zero cross detection unit 21, a circuit can be used which outputs a pulse when the sawtooth wave data (the digital value of the sawtooth wave) exceeds the threshold value other than zero. Also in this case, the zero cross is substantially detected by shifting the time axis.

Further, for example, the use of P1 that is the head clock signal and P3 that is the rear clock signal as in the above-described embodiment using a clock of 40 MHz is substantially the same as the use of P1, P5 among five continuously lining up clock signals from P1 to P5, as the head clock signal and the rear clock signal respectively, using a clock of 80 MHz. Accordingly, the number of digital values in a string is not limited to three but may be five or more in order to output the head clock signal and the rear clock signal respectively reading the head digital value and the last digital value in the string of odd digital values at regular intervals.

Example

Figure 12:
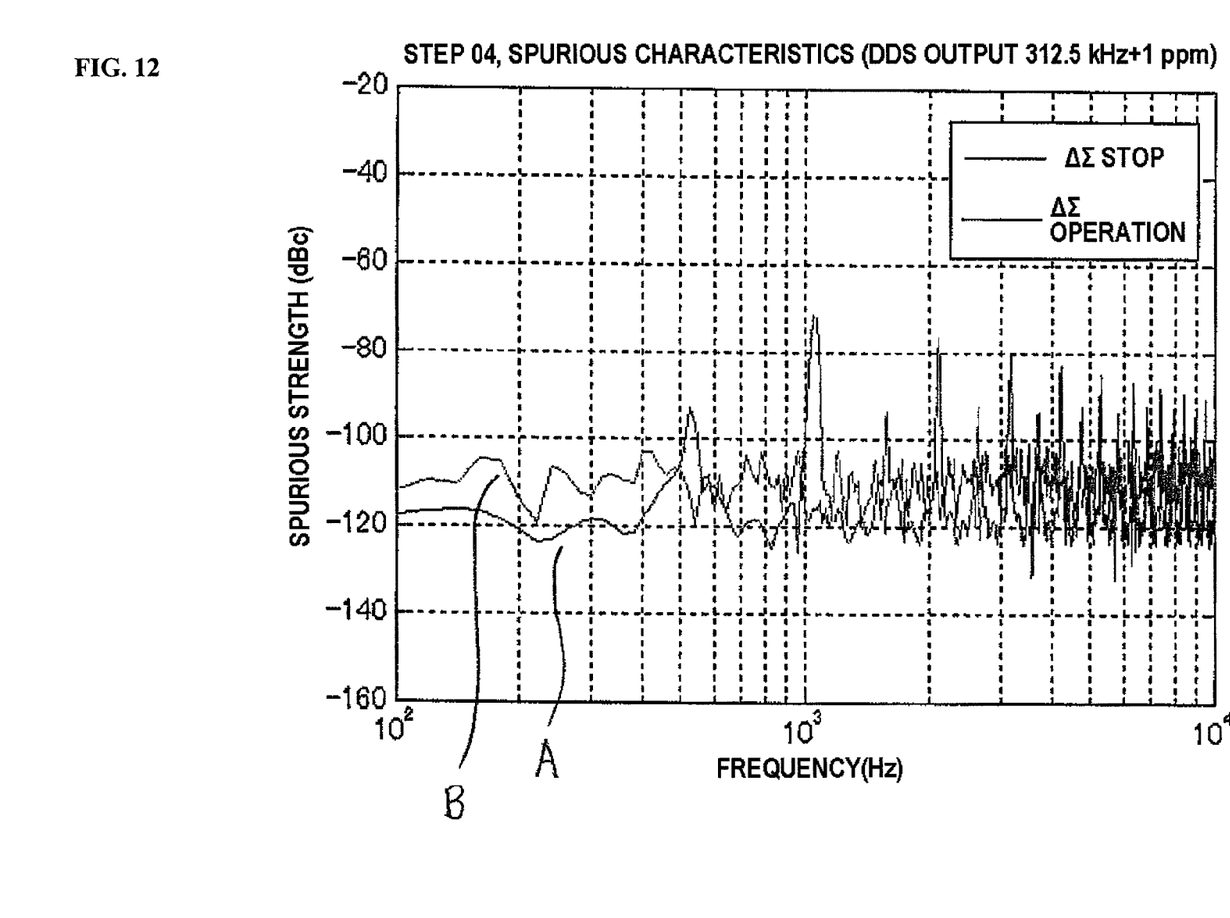
FIG. 12 is a characteristic chart indicating the frequency characteristics in the case of using only the clock signal P1 as the timing of the zero cross and the frequency characteristics in the present invention in comparison.

To confirm the effects of the present invention, the spurious characteristics of the frequency signal obtained from the reference signal generation unit 5 were investigated in the case of using the circuit illustrated in FIG. 1 (Example) and in the case of using only the clock signal P3 as the zero cross point (Comparative Example) respectively. The reference signal generation unit 5 is composed of a DDS (Direct Digital Synthesizer) and has a set frequency of 312.5 kHz. Note that the latter comparative example was carried out with the ΔΣ circuit 3 stopped in the circuit illustrated in FIG. 1. FIG. 12 is a graph indicating the spurious characteristics, in which A is for Example and B is for Comparative Example. As is found from the results, the spurious characteristics are excellent in the present invention.

What is claimed is:

1. A signal generating device outputting a pulse signal based on a timing when an integrated waveform in a sawtooth shape crosses over a previously set threshold value, said device comprising:
    a clock source outputting a clock signal;
    an integrated waveform generation unit receiving an inputted digital signal having a digital value according to a set frequency and integrating the digital value based on the clock signal to generate the integrated waveform in a sawtooth shape;
    a clock information output unit outputting a head clock signal and a rear clock signal reading a head digital value and a last digital value in a string of odd digital values at regular intervals including digital values before and after the previously set threshold value in a region where the digital value outputted from said integrated waveform generation unit changes in one direction;
    a circuit unit outputting a coefficient value corresponding to a ratio between the difference value among the head digital value and the threshold value and the difference value among the last digital value and the threshold value;
    a use ratio determination unit outputting a signal corresponding to a use ratio between the head clock signal and the rear clock signal regarded as a time point when the digital value of the integrated waveform is the threshold value for only a predetermined time, based on the coefficient value;
    a clock selection unit selecting and outputting one side of the head clock signal and the rear clock signal outputted from said clock information output unit, for only a predetermined time, by the signal corresponding to the use ratio outputted from said use ratio determination unit; and
    a signal output unit outputting a pulse signal obtained by being toggled by each clock signal outputted from said clock selection unit.

2. The signal generating device according to claim 1, wherein the previously set threshold value is zero.

3. The signal generating device according to claim 1, wherein assuming that the clock signals reading the head digital value and the last digital value are P1 and P3 respectively, and the clock signal reading a digital value at a middle in the string of the odd digital values is P2, said clock information output unit is configured to output the clock signals P1 and P3, and
    the head clock signal and the rear clock signal regarded as a time point when the digital value of the integrated waveform is the threshold value for only a predetermined time in said use ratio determination unit are the clock signals P1 and P3 respectively.

4. The signal generating device according to claim 1, wherein said clock selection unit is configured to select the head clock signal by one of "H" and "L" that are signal levels of the pulse signal being a selection signal, and select the rear clock signal by the other, and
    wherein said use ratio determination unit being a ΔΣ circuit outputting a PWM pulse string forming the selection signal having an average of a duty ratio being a value corresponding to the ratio between the digital value immediately before and the digital value immediately after the threshold value.

5. A frequency synthesizer feeding back a frequency signal outputted from a voltage controlled oscillator to a phase comparison unit via a frequency divider, comparing the fed back frequency signal to a reference frequency signal corresponding to a set frequency in the phase comparison unit, and inputting a comparison result into the voltage controlled oscillator,
    wherein a signal outputted from the signal generating device according to claim 1 is used as the reference frequency signal.

* * * * *